(12) United States Patent
Vyavahare et al.

(10) Patent No.: US 10,262,722 B2
(45) Date of Patent: *Apr. 16, 2019

(54) FAIL-SAFE INPUT/OUTPUT (IO) CIRCUIT

(71) Applicant: TEXAS INSTRUMENTS INCORPORATED, Dallas, TX (US)

(72) Inventors: Prajkta Vyavahare, Indore (IN); Rajat Chauhan, Dehradun (IN); Siva Srinivas Kothamasu, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/447,230

(22) Filed: Mar. 2, 2017

(65) Prior Publication Data

US 2017/0178714 A1     Jun. 22, 2017

Related U.S. Application Data

(63) Continuation of application No. 15/236,797, filed on Aug. 15, 2016, now Pat. No. 9,627,035, which is a
(Continued)

(30) Foreign Application Priority Data

Jul. 31, 2014   (IN) .......................... 3758/CHE/2014

(51) Int. Cl.
| | |
|---|---|
| *G11C 7/10* | (2006.01) |
| *G11C 11/4093* | (2006.01) |
| *G11C 11/4074* | (2006.01) |
| *H03K 17/687* | (2006.01) |
| *G06F 13/10* | (2006.01) |
| *G11C 11/4094* | (2006.01) |
| *G06F 1/3296* | (2019.01) |

(52) U.S. Cl.
CPC ........ *G11C 11/4093* (2013.01); *G06F 1/3296* (2013.01); *G06F 13/102* (2013.01); *G11C 7/1057* (2013.01); *G11C 11/4074* (2013.01); *G11C 11/4094* (2013.01); *H03K 17/687* (2013.01); *Y02D 10/14* (2018.01)

(58) Field of Classification Search
CPC ............ G11C 11/4086; G11C 11/4094; G11C 11/4074; G11C 7/065; G11C 7/1078; G11C 7/1087
USPC ......... 365/51, 63, 189.08, 189.09, 226, 228, 365/230.08; 327/541, 544, 566, 108
See application file for complete search history.

(56) References Cited

U.S. PATENT DOCUMENTS

5,349,247 A    9/1994 Hush
5,473,271 A    12/1995 Little et al.
(Continued)

*Primary Examiner* — Gene N Auduong
(74) *Attorney, Agent, or Firm* — John R. Pessetto; Charles A. Brill; Frank D. Cimino (57) ABSTRACT

The disclosure provides an input/output (IO) circuit powered by an input/output (IO) supply voltage. The IO circuit includes a cutoff circuit that receives a first invert signal, the IO supply voltage, a bias voltage and a pad voltage. An output stage is coupled to the cutoff circuit. The output stage receives a first signal, a second signal and the bias voltage. A pad is coupled to the output stage, and a voltage generated at the pad is the pad voltage. The cutoff circuit and the output stage maintain the pad voltage at logic high when the IO supply voltage transition below a defined threshold.

21 Claims, 5 Drawing Sheets

Related U.S. Application Data continuation of application No. 14/813,949, filed on Jul. 30, 2015, now abandoned.

(56) References Cited

U.S. PATENT DOCUMENTS

| | | | |
|---|---|---|---|
| 5,500,817 A | 3/1996 | McLaury | |
| 5,561,384 A | 10/1996 | Reents | |
| 5,615,158 A | 3/1997 | Ochoa | |
| 6,038,655 A | 3/2000 | Little et al. | |
| 6,167,527 A | 12/2000 | Little et al. | |
| 8,843,723 B1 * | 9/2014 | Warner | G06F 13/1689 |
| | | | 711/158 |
| 9,627,035 B2 * | 4/2017 | Vyavahare | G11C 11/4093 |
| 2005/0232053 A1 * | 10/2005 | Azuma | G11O 5/147 |
| | | | 365/226 |
| 2009/0097302 A1 * | 4/2009 | Yamaoka | G11O 5/146 |
| | | | 365/156 |
| 2012/0226929 A1 * | 9/2012 | Lee | G06F 11/3041 |
| | | | 713/340 |
| 2016/0035412 A1 | 2/2016 | Vyavahare et al. | |
| 2016/0078909 A1 * | 3/2016 | Arai | G11C 29/022 |
| | | | 365/189.05 |

* cited by examiner

FAIL-SAFE INPUT/OUTPUT (IO) CIRCUIT

CROSS REFERENCE TO RELATED APPLICATIONS

This application is a continuation of U.S. patent application Ser. No. 15/236,797, filed Aug. 15, 2016, which is a continuation of U.S. patent application Ser. No. 14/813,949, filed Jul. 30, 2015, now abandoned, which claims priority from India provisional patent application No. 3758/CHE/2014 filed on Jul. 31, 2014, all of which are hereby incorporated by reference as if fully set forth herein.

TECHNICAL FIELD

The present disclosure is generally related to integrated circuits (ICs), and more particularly to an integrated circuit having a fail-safe input/output (IO) circuit.

BACKGROUND

The ever-increasing complexity and performance requirements of portable electronic devices call for effective system-level power management in Integrated circuits (ICs). Having one or more switchable power domains in core-logic is a well-known low-power methodology that is employed for ICs in portable electronic devices. When a supply of a specific power domain is powered down, the outputs of that power-domain serving as inputs to IO (input/output) circuits are no longer valid and these IO circuits need to be tri-stated to avoid possible leakage current.

An IO circuit drives/receives signals on a pad to interface with the outside world. If the IO circuit is not properly tri-stated, it results in high leakage currents (conduction currents) from the pad into the IO circuit. A similar condition results when the IO supply voltage is powered up or down, while the pad is held at a logic-HIGH.

A typical example of this is a DRAM (Dynamic random-access memory) controller IC used in conjunction with a DDR3 SDRAM (Synchronous dynamic random access memory). The DDR3 SDRAM JEDEC standard provides an ultra-low power DRAM feature using a RESET pin. The DRAM controller IC includes an IO circuit which is interfaced to the DDR3 SDRAM through a pad. This pad serves as the RESET pin of the DRAM controller.

The ultra-low power feature allows turning off all interface signals and preserving DRAM content by holding RESET pin (or the pad) at logic high, putting DRAM in self refresh mode. This becomes a very attractive feature in low power application space since it allows the complete power down of DRAM controller IC when the DRAM controller IC is not being accessed, with only RESET pin being held high. To enable this ultra-low power state, an IO power supply connection for the DRAM controller and the DDR3 SDRAM are separated on board. The sharing of the same IO power supply would power down the DDR3 SDRAM as well, thus clearing its content.

When the IO power supply to the DRAM controller is powered down, and the RESET pin is held high, a leakage current flows from the RESET pin (the pad) to the IO circuit in the DRAM controller when the IO circuit is not properly tri-stated. Because of this condition, the RESET pin undergoes a glitch. This resets the DDR3 SDRAM. The overhead of re-initializing the DDR3 SDRAM at every power cycle is significant.

SUMMARY

According to an aspect of the disclosure, an input/output IO circuit powered by an input/output (IO) supply voltage is disclosed. The IO circuit includes a cutoff circuit that receives a first invert signal, the IO supply voltage, a bias voltage and a pad voltage. An output stage is coupled to the cutoff circuit. The output stage receives a first signal, a second signal and the bias voltage. A pad is coupled to the output stage, and a voltage generated at the pad is the pad voltage. The cutoff circuit and the output stage maintain the pad voltage at logic high when the IO supply voltage transition below a defined threshold.

DETAILED DESCRIPTION OF THE EMBODIMENTS

Figure 1:
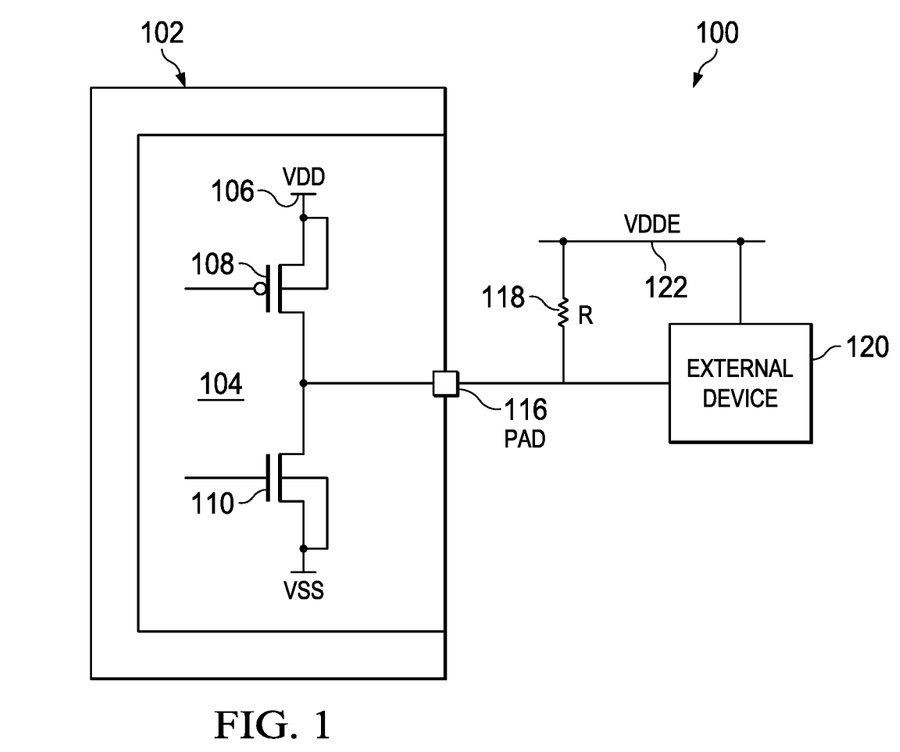
FIG. 1 is a block diagram illustrating an example architecture in which several aspects of the present invention can be implemented.

FIG. 1 is a block diagram illustrating an example architecture 100 in which several aspects of the present invention can be implemented. The architecture 100 includes an integrated circuit (IC) 102. The IC 102 is coupled to an external device 120 through a pad 116. In one example, the IC 102 is a memory controller, and the external device 120 is a memory. In another example, the IC 102 is a DRAM controller, and the external device 120 is a DDR3 SDRAM. In one version, the IC 102 and the external device 120 are integrated on one substrate. In another version, the IC 102 and the external device 120 are integrated on different substrates.

The IC 102 includes an input/output IO circuit 104. The IO circuit 104 is coupled to the external device 120 through the pad 116. The IO circuit 104 is one of the many ways of implementing an IO circuit and variations, and alternative constructions are apparent and well within the spirit and scope of the disclosure. The IO circuit 104 includes a PMOS transistor 108 and an NMOS transistor 110.

The PMOS transistor 108 is coupled to an IO supply voltage VDD 106, and the NMOS transistor 110 is coupled to a ground terminal VSS. The specifically disclosed part of the IO circuit 104 are provided to explain the logical flow of methods and are understood not to limit the scope of the present disclosure. The external device 120 is coupled to an external supply voltage VDDE 122. The pad 116 is coupled to the external supply voltage VDDE 122 through an external resistor R 118. The architecture 100 may include one or more additional components known to those skilled in the relevant art and are not discussed here for simplicity of the description.

The operation of the IO circuit 104 illustrated in FIG. 1 is now explained. The IO circuit 104 operates in a normal mode and a low power mode. In normal mode, the IO supply voltage VDD 106 is at logic high. The PMOS transistor 108 is activated and the NMOS transistor 110 is inactivated. This drives the pad 116 to logic high. The logic high at the pad 116 activates the external device 120. When the external device 120 is a memory, and the IC 102 is a memory controller, a set of read and write operations are performed in the memory by the memory controller during the normal mode.

During the low power mode, the IO supply voltage VDD 106 transitions below a defined threshold. However, the pad 116 is held high to preserve the contents of the external device 120, which in one example is a memory. The pad 116 is driven to logic high by the external supply voltage VDDE 122. The pad 116 is tri-stated to prevent a leakage current from the external supply voltage VDDE 122 to the IO circuit 104. The leakage current can be due to multiple factor which may include, but not limited to, a forward biased parasitic junction diode of the PMOS transistor 108 and a source to drain current through the activated PMOS transistor 108.

The pad 116 is maintained at logic high so that the external device 120 is not required to be re-initialized. If the pad 116 goes below the logic high level, the external device 120 is reset. Hence, it is important that the IO circuit 104 does not provide any path for the current from the pad 116 to discharge to the ground terminal VSS or to a terminal at logic low.

Figure 2:
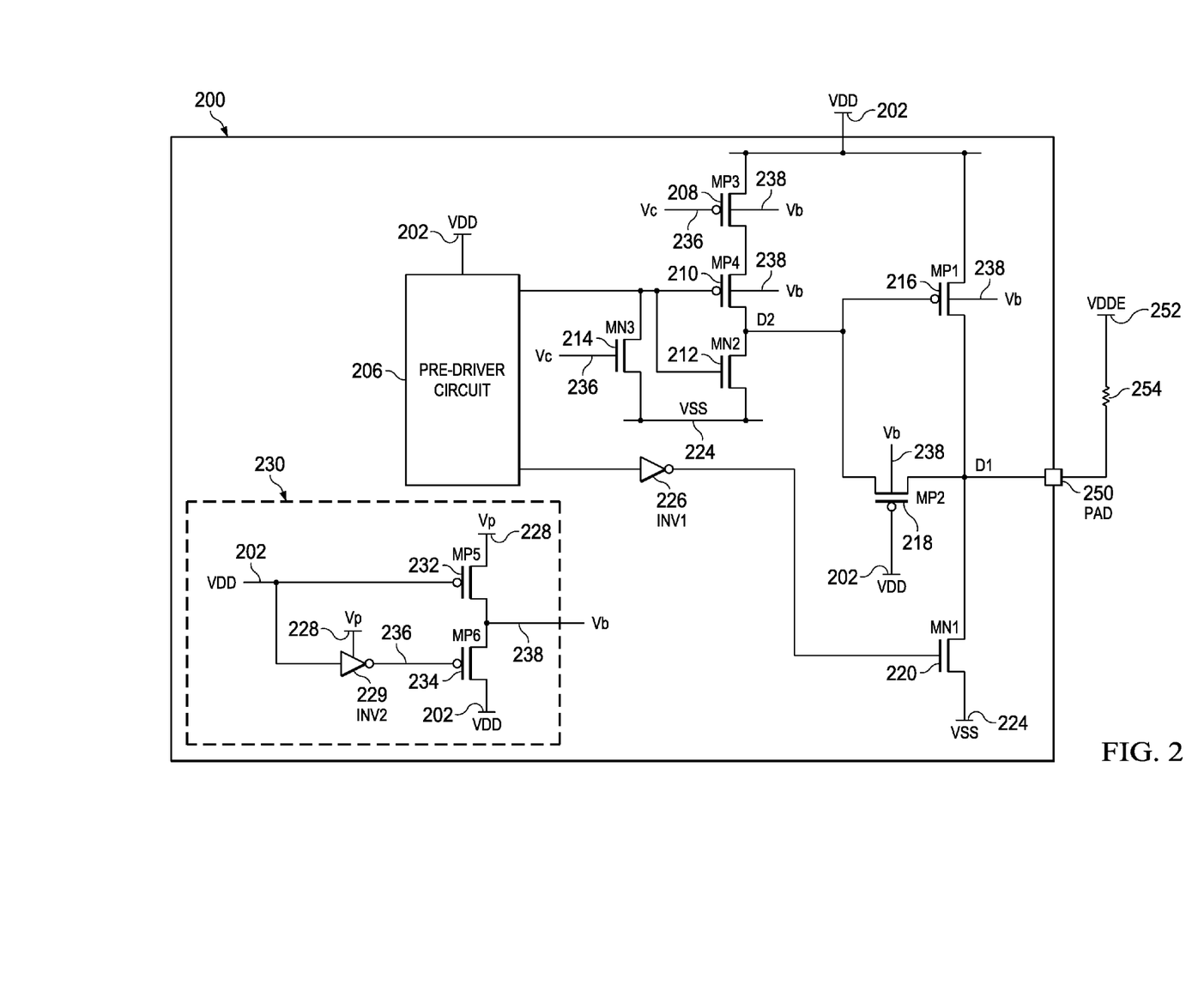
FIG. 2 illustrates an input/output (IO) circuit.

FIG. 2 illustrates an input/output IO circuit 200. The IO circuit 200 is powered by an IO supply voltage VDD 202. The IO circuit 200 includes a pad 250. The pad 250 is coupled to an external supply voltage VDDE 252 through an external resistor R 254. The IO circuit 200 includes a first PMOS transistor MP1 216, a second PMOS transistor MP2 218 and a first NMOS transistor MN1 220. The IO circuit 200 also includes a third PMOS transistor MP3 208, a fourth PMOS transistor MP4 210, a second NMOS transistor MN2 212 and a third NMOS transistor MN3 214.

The IO circuit 200 includes a pre-driver circuit 206 that receives the IO supply voltage VDD 202. The IO circuit 200 also includes a first inverter INV1 226 which is coupled between the pre-driver circuit 206 and the first NMOS transistor MN1 220. The first PMOS transistor MP1 216 includes a gate terminal that is coupled to a second node D2, a source terminal that is coupled to the IO supply voltage VDD 202 and a drain terminal coupled to a first node D1. A body terminal of the first PMOS transistor MP1 216 receives a bias voltage Vb 238. The pad 250 is coupled to the first node D1.

The first NMOS transistor MN1 220 includes a gate terminal that is coupled to the first inverter INV1 226, a source terminal coupled to a ground terminal Vss 224 and a drain terminal coupled to the first node D1. The second PMOS transistor MP2 218 includes a gate terminal that is coupled to the IO supply voltage VDD 202, a drain terminal coupled to the first node D1 and a source terminal coupled to the second node D2. The body terminal of the second PMOS transistor MP2 218 receives the bias voltage Vb 238.

The third PMOS transistor MP3 208 includes a source terminal that is coupled to the IO supply voltage VDD 202, a gate terminal receives a control signal Vc 236, and a body terminal receives the bias voltage Vb 238. The fourth PMOS transistor MP4 210 includes a gate terminal that is coupled to the pre-driver circuit 206, a source terminal coupled to a drain terminal of the third PMOS transistor MP3 208, a body terminal that receives the bias voltage Vb 238, and a drain terminal coupled to the second node D2.

The second NMOS transistor MN2 212 includes a gate terminal that is coupled to the pre-driver circuit 206, a drain terminal coupled to the second node D2 and a source terminal coupled to the ground terminal Vss 224. The third NMOS transistor MN3 214 includes a gate terminal that receives the control signal Vc 236, a drain terminal that is coupled to the pre-driver circuit 206, and a source terminal coupled to the ground terminal Vss 224.

The IO circuit 200 includes a bias voltage generator circuit 230. The bias voltage generator circuit includes a second inverter INV2 229, a fifth PMOS transistor MP5 232 and a sixth PMOS transistor MP6 234. The second inverter INV2 229 receives the IO supply voltage VDD 202 as an input and a pad voltage Vp 228 as an enable signal. The second inverter INV2 229 generates the control signal Vc 236 in response to the IO supply voltage VDD 202 and the pad voltage Vp 228. The fifth PMOS transistor MP5 includes a gate terminal that receives the IO supply voltage VDD 202 and a source terminal that receives the pad voltage Vp 228.

The sixth PMOS transistor MP6 234 includes a gate terminal that receives the control signal Vc 236 and a source terminal that is coupled to the IO supply voltage VDD 202. A drain terminal of the fifth PMOS transistor MP5 232 is coupled to a drain terminal of the sixth PMOS transistor MP6 234, and generates the bias voltage Vb 238.

The operation of the IO circuit 200 illustrated in FIG. 2 is explained now. The IO circuit 200 operates in a normal mode and a low power mode. In normal mode, the IO supply voltage VDD 202 is at logic high. The first PMOS transistor MP1 216 is activated, and the first NMOS transistor MN1 220 is inactivated. Thus, a voltage at the pad 250, which is the pad voltage Vp 228 is at logic high.

The pre-driver circuit 206 provides a logic high signal to the first inverter INV1 which generates a logic low signal to inactivate the first NMOS transistor MN1 220. The pre-driver circuit 206 provides a logic high signal to the fourth PMOS transistor MP4 210 and the second NMOS transistor MN2 212. The fourth PMOS transistor MP4 210 is inactivated, and the second NMOS transistor MN2 212 is activated. Hence, a logic low signal is generated at the second node D2, which activates the first PMOS transistor MP1 216.

Since, the IO supply voltage VDD 202 is at logic high, and the pad voltage Vp 228 is at logic high, the control signal Vc 236 generated by the second inverter INV2 229 is at logic low. The fifth PMOS transistor MP5 232 is inactivated since the IO supply voltage VDD 202 is at logic high. The sixth PMOS transistor MP6 234 is activated since the control signal Vc 236 is at logic low. Thus, the bias voltage Vb is at the same level as the IO supply voltage VDD 202 i.e. at logic high. Since the control signal Vc 236 is at logic low, the third NMOS transistor MN3 is inactivated. Thus, the pad 250 remains at logic high.

In low power mode, the IO supply voltage VDD 202 transitions from logic high to a logic low. However, the pad 250 is maintained at logic high. The pad 250, in one example, is coupled to an external device for example a memory. The pad 250 is held high to preserve the contents of the external device. The pad 250 is driven to logic high by the external supply voltage VDDE 252.

The first PMOS transistor MP1 216 and the first NMOS transistor MN1 220 are tri-stated before the IO supply voltage VDD 202 transitions to logic low. While, the IO supply voltage VDD 202 transitions to logic low, the second node D2 follows the IO supply voltage VDD 202 until the second PMOS transistor MP2 218 is activated. To ensure, that the first PMOS transistor MP1 216 is inactivated during transition of the IO supply voltage VDD 202 to logic low, the second PMOS transistor MP2 218 is required to be activated before the first PMOS transistor MP1 216 is activated. However, mismatch and difference in size of the first PMOS transistor MP1 216 and the second PMOS transistor MP2 218 causes the second PMOS transistor MP2 218 to be activated after the first PMOS transistor MP1 216 is activated.

Under this condition, the first PMOS transistor MP1 216 and the external resistor R 254 forms a potential divider. This causes a glitch in the pad voltage Vp 228 (voltage at the pad 250). At certain combinations of the sizes and values of the first PMOS transistor MP1 216 and the second PMOS transistor MP2 218, the pad voltage Vp 228 gets stuck at an intermediate value until the IO supply voltage VDD 202 transitions to logic high again.

A glitch or stuck at an intermediate value in the pad voltage Vp 228 causes a static current (leakage current) to flow through the IO circuit 200 during the transition of the IO supply voltage from the logic high to logic low. The leakage current flows from the external supply voltage VDDE 252 through the first PMOS transistor MP1 towards the IO supply voltage VDD 202 (which is transitioning to logic low). The leakage current also flows from the external supply voltage VDDE 252 through the second PMOS transistor MP2 218, the fourth PMOS transistor MP4 210 and the third PMOS transistor MP3 208.

Thus, the IO circuit 200 does not provide a fail-safe operation especially when used in a memory controller, and the pad 250 is a reset pin to a memory which is coupled to the memory controller. The content of the memory is lost because of the glitch at the pad 250. The overhead of re-initializing the memory at every power cycle is significant.

Figure 3:
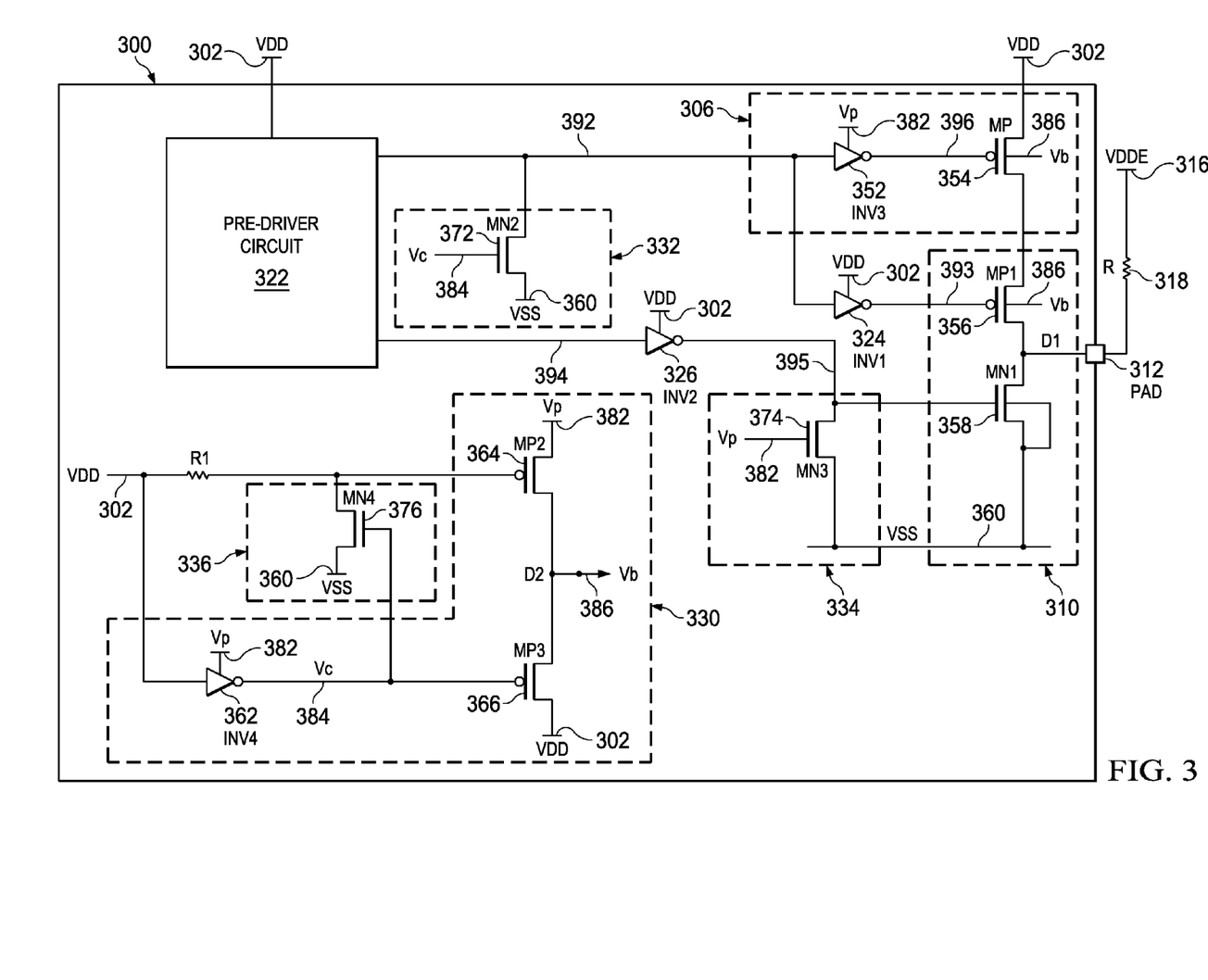
FIG. 3 illustrates an input/output IO circuit, according to an embodiment.

FIG. 3 illustrates an input/output IO circuit, according to an embodiment. The IO circuit 300 is powered by an input/output IO supply voltage VDD 302. The IO circuit 300 includes a cutoff circuit 306, an output stage 310 and a pad 312. The output stage 310 is coupled to the cutoff circuit 306, and the pad 312 is coupled to the output stage 310. The pad 312 is coupled to an external supply voltage VDDE 316 through an external resistor R 318.

The IO circuit 300 also includes a pre-driver circuit 322, a first inverter INV1 324 and a second inverter INV2 326. The first inverter INV1 324 and the second inverter INV2 326 are coupled to the pre-driver circuit 322. Each of the first inverter INV1 324 and the second inverter INV2 326 receives the IO supply voltage VDD 302 as an enable signal. The IO circuit 300 also includes a bias voltage generator 330, a first hold circuit 332, a second hold circuit 334 and a third hold circuit 336. The first hold circuit 332 and the second hold circuit 334 are coupled to the pre-driver circuit 322. The third hold circuit 336 is coupled to the bias voltage generator 330.

The cutoff circuit 306 includes a third inverter INV3 352 and a primary PMOS transistor MP 354. The primary PMOS transistor MP 354 includes a gate terminal which is coupled to the third inverter INV3 352 and a source terminal which is coupled to the IO supply voltage VDD 302. A body terminal of the primary PMOS transistor MP 354 receives a bias voltage Vb 386.

The output stage 310 includes a first PMOS transistor MP1 356 whose gate terminal is coupled to the first inverter INV1 324 and whose source terminal is coupled to a drain terminal of the primary PMOS transistor MP 354. A body terminal of the first PMOS transistor MP1 356 receives the bias voltage Vb 386. The output stage 310 also includes a first NMOS transistor MN1 358 whose gate terminal is coupled to the second inverter INV2 326 and whose source terminal is coupled to a ground terminal Vss 360. A drain terminal of the first NMOS transistor MN1 358 and a drain terminal of the first PMOS transistor MP1 356 are coupled to form a first node D1 which is coupled to the pad 312.

The bias voltage generator 330 includes a fourth inverter INV4 362, a second PMOS transistor MP2 364 and a third PMOS transistor 366. The fourth inverter INV4 receives the IO supply voltage VDD 302 as an input and a pad voltage Vp 382 as an enable signal. The pad voltage Vp 382 is a voltage at the pad 312. The second PMOS transistor MP2 364 includes a gate terminal that receives the IO supply voltage VDD 302 through a resistor R1 and a source terminal that receives the pad voltage Vp 382.

The third PMOS transistor MP3 366 includes a gate terminal that receives a control signal Vc 384 and a source terminal that receives the IO supply voltage VDD 302. A drain terminal of the second PMOS transistor MP2 364 and a drain terminal of the third PMOS transistor MP3 366 are coupled to form a second node D2. The bias voltage Vb 386 is generated at the second node D2.

The first hold circuit 332 includes a second NMOS transistor MN2 372 whose gate terminal receives the control signal Vc 384 and whose drain terminal is coupled to the pre-driver circuit 322. The second hold circuit 334 includes a third NMOS transistor MN3 374 whose gate terminal receives the pad voltage Vp 382 and whose drain terminal is coupled to the second inverter INV2 326. The third hold circuit 336 includes a fourth NMOS transistor MN4 376 whose gate terminal receives the control signal Vc 384 and whose drain terminal receives the IO supply voltage VDD 302 through the resistor R1.

A source terminal of each of the second NMOS transistor MN2 372, the third NMOS transistor MN3 374 and the fourth NMOS transistor MN4 376 is coupled to the ground terminal Vss 360. The IO circuit 200 may include one or more additional components known to those skilled in the relevant art and are not discussed here for simplicity of the description.

The operation of the IO circuit 300 illustrated in FIG. 3 is explained now. In one example, the IO circuit 300 is similar to the IO circuit 104 illustrated in FIG. 1. The pre-driver circuit 322 generates a first invert signal 392 and a second invert signal 394. The first inverter INV1 324 generates a first signal 393 in response to the first invert signal 392 and the IO supply voltage VDD 302. The second inverter INV2 326 generates a second signal 395 in response to the second invert signal 394 and the IO supply voltage VDD 302. The third inverter INV3 352 generates a third signal 396 in response to the first invert signal 392 and the pad voltage Vp 382.

The bias voltage generator 330 generates the control signal Vc 384 and the bias voltage Vb 386 in response to the IO supply voltage VDD 302 and the pad voltage Vp 382. The IO circuit 300 operates in a normal mode and a low power mode. In normal mode, the IO supply voltage VDD 302 is at logic high. The control signal Vc 384 generated by the fourth inverter INV4 is at logic low. The bias voltage Vb 386 is at the same potential as IO supply voltage VDD 302. A state of the pad 312 is determined by a state of first invert signal 392 and the second invert signal 394 generated by the pre-driver circuit 322.

The pad 312 is at logic low when the first invert signal 392 and the second invert signal 394 generated by the pre-driver circuit 322 are at logic low. When the first invert signal 392 is at logic low, the third signal 396 follows the pad voltage Vp 382. Also, the first signal 393 follows the IO supply voltage VDD 302 which inactivates the first PMOS transistor MP1 356. Similarly, as the second invert signal 394 is at logic low, the second signal 395 generated by the second inverter INV2 326 transitions to logic high which activates the first NMOS transistor MN1 358. Thus, the pad 312 is at logic low.

The pad 312 is at logic high when the when the first invert signal 392 and the second invert signal 394 generated by the pre-driver circuit 322 are at logic high. When the first invert signal 392 is at logic high, the third signal 396 is at logic low, and therefore, the primary PMOS transistor MP 354 is activated. Also, the first signal 393 is at logic low which activates the first PMOS transistor MP1 356. Similarly, as the second invert signal 394 is at logic high, the second signal 395 generated by the second inverter INV2 326 is at logic low which inactivates the first NMOS transistor MN1 358. Thus, the pad 312 is at logic high.

In low power mode, the IO supply voltage VDD 302 transitions below a defined threshold. In one example, the IO supply voltage VDD 302 transitions from logic high to logic low. In another example, the IO supply voltage VDD 302 drops below a level defined as logic high. In one version, the defined threshold is any voltage less than a voltage level defined as logic high. In another version, when the logic high is defined as V volts, the defined threshold is x volts less than the V volts, where V and x are integers. In one example, a range of x is 0.2 volts to 0.7 volts, and a range of V is 1.5 volts to 3.3 volts. Before IO supply voltage VDD 302 transitions below a defined threshold, the output stage 310 is tri-stated while the external supply voltage VDDE 316 drives the pad voltage Vp 382 (voltage at the pad 312) to logic high. The control signal Vc 384 generated by the fourth inverter INV4 362 follows the pad voltage Vp 382 which inactivates the third PMOS transistor MP3 366.

The bias voltage Vb 386 generated at the second node D2 follows the pad voltage Vp 382 as the second PMOS transistor MP2 364 is activated and the third PMOS transistor MP3 366 is inactivated. The second NMOS transistor MN2 372 is activated as the control signal Vc 384 follows the pad voltage Vp 382. The first invert signal 392 transitions to logic low when the second NMOS transistor MN2 372 is activated.

Since, the first invert signal 392 is at logic low, the third signal 396 generated by the third inverter INV3 352 transitions to the pad voltage Vp 382. This inactivates the primary PMOS transistor MP 354. Also, the first signal 393 transitions to the IO supply voltage VDD 302. This maintains the first PMOS transistor MP1 356 in activated state. The second signal 395 is maintained at logic low when the third NMOS transistor MN3 374 is activated by the pad voltage Vp 382. The first NMOS transistor MN1 358 is inactivated when the second signal 395 is at logic low.

As the IO supply voltage VDD 302 starts transitioning below a defined threshold, the first PMOS transistor MP1 356 is activated when the first signal 393 (which is following the IO supply voltage VDD 302) goes below the pad voltage Vp 382. However, a leakage path from the pad 312 to the IO supply voltage VDD 302 is not available since the primary PMOS transistor MP 354 is inactivated. This ensures that during the transition of the IO supply voltage VDD 302 below a defined threshold, there is no leakage current from the external supply voltage VDDE 316 to the IO circuit 300. Thus the IO circuit 300 prevents a glitch or stuck at an intermediate value in the pad voltage Vp 382.

Thus, the IO circuit 300 provides a fail-safe operation, and ensures a robust functionality when the IO circuit 300 is used in a memory controller, and the pad 312 is a reset pin to a memory which is coupled to the memory controller. The content of the memory are preserved because there is no glitch at the pad 312. The operation of the IO circuit 300 in low power mode provides a significant reduction in overall power consumption of a circuit using the IO circuit 300.

Figure 4A:
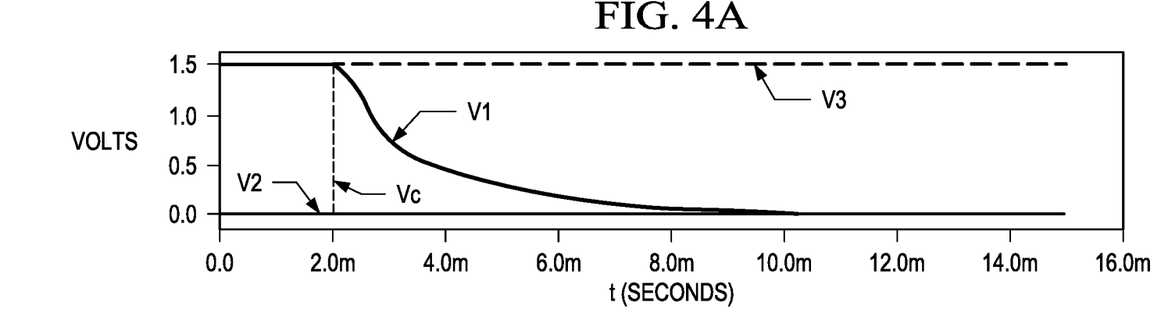
FIGS. 4A and 4B are timing diagrams to illustrate an operation of an IO circuit, according to an embodiment.
Figure 4B:
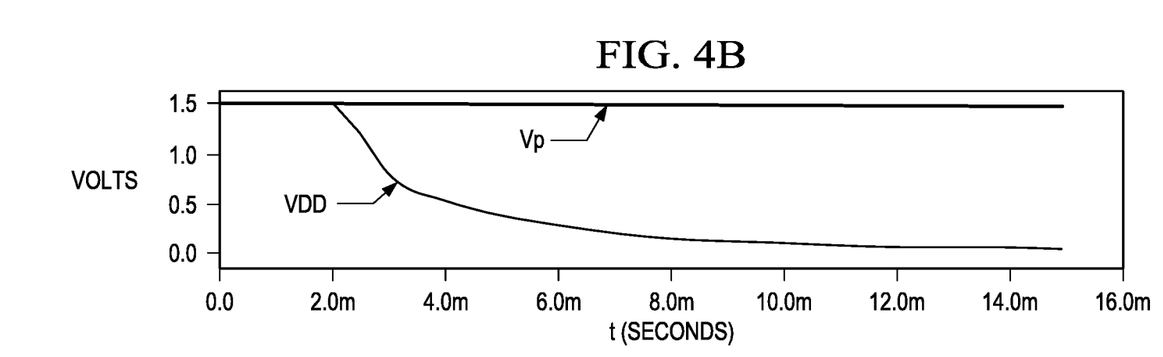

FIGS. 4A and 4B are timing diagrams to illustrate an operation of an IO circuit, according to an embodiment. The FIGS. 4A and 4B illustrate operation of the IO circuit 300. FIG. 4A illustrates the first signal 393 (V1), the second signal 395 (V2), the third signal 396 (V3) and the control signal Vc 384. FIG. 4B illustrates the IO supply voltage VDD and the pad voltage Vp 382 (which is the voltage at the pad 312).

The FIG. 4B illustrates that the IO supply voltage VDD 302 is at logic high which is equivalent to 1.5 volts. When the IO supply voltage VDD 302 transitions below the defined threshold the control signal Vc 384 transition from logic high to logic low, and again transitions from logic low to logic high. The first invert signal 392 transitions to logic low when the second NMOS transistor MN2 372 is activated. Therefore, the first signal 393 (V1) transitions to the IO supply voltage VDD. The third signal 396 (V3) transitions to the pad voltage Vp 382, and remains at logic high.

The second signal 395 (V2) is maintained at logic low when the third NMOS transistor MN3 374 is activated by the pad voltage Vp 382. The pad voltage Vp 382 remains at logic high when the IO supply voltage VDD 302 transitions below a defined threshold. The external supply voltage VDDE 316 provides the current to the pad 312 through the external resistor R 318. This ensures that during the transition of the IO supply voltage VDD 302 below a defined threshold, there is no leakage current from the external supply voltage VDDE 316 to the IO circuit 300. Thus the IO circuit 300 prevents a glitch or stuck at an intermediate value in the pad voltage Vp 382.

Figure 5:
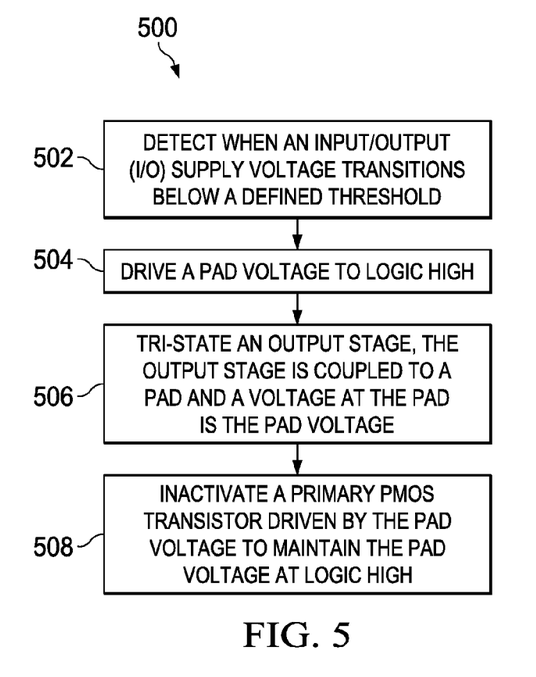
FIG. 5 is a flowchart illustrating a method, according to an embodiment.

FIG. 5 is a flowchart 500 illustrating a method, according to an embodiment. At step 502, it is detected when the input/output IO supply voltage transitions below a defined threshold. In one example, the IO supply voltage transitions from logic high to logic low. In another example, the IO supply voltage drops below a level defined as logic high. For example, in FIG. 4, the IO supply voltage VDD transitions below 1.5 volt.

A pad voltage is driven to logic high, at step 504. In IO circuit 300 (illustrated in FIG. 3) the external supply voltage VDDE 316 drives the pad voltage Vp 382 (voltage at the pad 312) to logic high. An output stage is tri-stated at step 506. The output stage is coupled to a pad, and a voltage at the pad is the pad voltage. A control signal is generated from the pad voltage and the IO supply voltage.

A bias voltage is generated from the pad voltage, the IO supply voltage and the control signal. The control signal and the bias voltage follow the pad voltage when the pad voltage is at logic high. The first invert signal transitions to logic low when the control signal follows the pad voltage.

Also, the first signal transitions to the IO supply voltage which maintains a first PMOS transistor in the output stage in activated state. A second signal is maintained at logic low which inactivates a first NMOS transistor in the output stage.

At step 508, a primary PMOS transistor driven by the pad voltage is inactivated to maintain the pad voltage at logic high. A third signal is generated from the first invert signal and the pad voltage. The third signal transitions to the pad voltage. The third signal is provided to a gate terminal of the primary PMOS transistor, and a drain terminal of the primary PMOS transistor is coupled to a source terminal of the first PMOS transistor. This inactivates the primary PMOS transistor.

Figure 6:
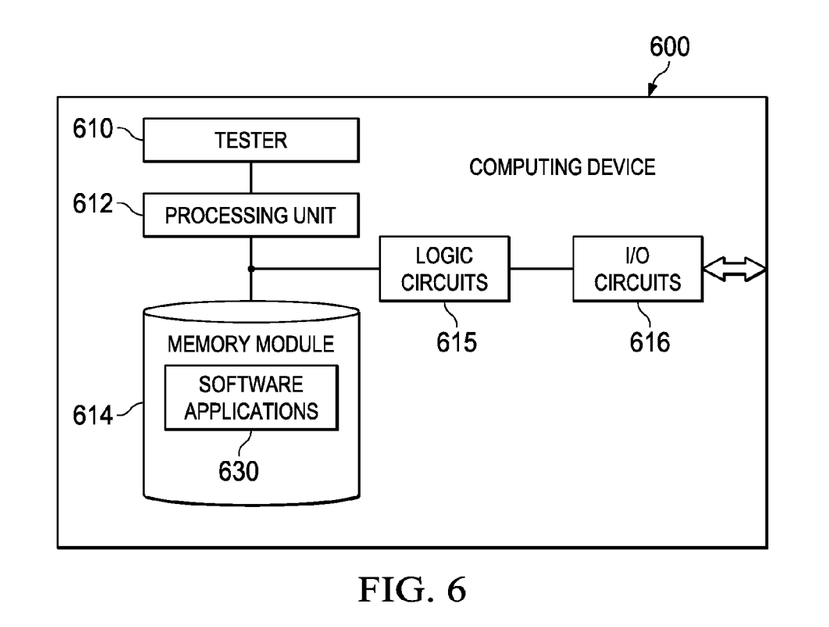
FIG. 6 illustrates a computing device according to an embodiment.

FIG. 6 illustrates a computing device according to an embodiment. The computing device 600 is, or is an integrated circuit incorporated into, a mobile communication device, such as a mobile phone, a personal digital assistant, a personal computer, or any other type of electronic system.

In some embodiments, the computing device 600 can be one of, but not limited to, microcontroller, microprocessor or a system-on-chip (SoC) which includes a processing unit 612 such as a CPU (Central Processing Unit), a memory module 614 (e.g., random access memory (RAM)) and a tester 610. The processing unit 612 can be, for example, a CISC-type (Complex Instruction Set Computer) CPU, RISC-type CPU (Reduced Instruction Set Computer), or a digital signal processor (DSP).

The memory module 614 (which can be memory such as RAM, flash memory, or disk storage) stores one or more software applications 630 (e.g., embedded applications) that, when executed by the processing unit 612, perform any suitable function associated with the computing device 600. The tester 610 comprises logic that supports testing and debugging of the computing device 600 executing the software applications 630. For example, the tester 610 can be used to emulate a defective or unavailable component(s) of the computing device 600 to allow verification of how the component(s), were it actually present on the computing device 600, would perform in various situations (e.g., how the component(s) would interact with the software application 630). In this way, the software applications 630 can be debugged in an environment which resembles post-production operation.

The processing unit 612 typically comprises cache-memory and logic which store and use information frequently accessed from the memory module 614 and is responsible for the complete functionality of the computing device. The computing device 600 includes a plurality of logic circuits 615 coupled to the processing unit 612 and the memory module 614. An IO circuit 616 is coupled to at least one logic circuit of the plurality of logic circuits 615. The IO circuit 616 acts as an interface between the computing device 600 and the external world. In one example, the IO circuit 616 is part of at least one logic circuit in the computing device 600. The IO circuit 616 is analogous to the IO circuit 300 in connection and operation.

The IO circuit 616 is powered by an IO supply voltage. The IO circuit includes a pad which interfaces the IO circuit 616 to the external world. The IO circuit 616 ensures that during the transition of the IO supply voltage below a defined threshold, there is no leakage current from any external supply voltage to the IO circuit 616. Thus the IO circuit 616 prevents a glitch or stuck at an intermediate value in a voltage at the pad.

Thus, the IO circuit 616 provides a fail-safe operation, and ensures a robust functionality when the IO circuit 300 is used in the computing device. The IO circuit 616 maintains the pad at logic high even when the IO supply voltage transition below a defined threshold.

In the foregoing discussion, the terms "connected" means at least either a direct electrical connection between the devices connected or an indirect connection through one or more passive intermediary devices. The term "circuit" means at least either a single component or a multiplicity of passive or active components, that are connected together to provide a desired function. The term "signal" means at least one current, voltage, charge, data, or other signal. Also, the terms "connected to" or "connected with" (and the like) are intended to describe either an indirect or direct electrical connection. Thus, if a first device is coupled to a second device, that connection can be through a direct electrical connection, or through an indirect electrical connection via other devices and connections. Further, the term "logic high" is generally intended to describe a signal that is at logic state "1," and the term "logic low" is generally intended to describe a signal that is at logic state "0." Also, the terms "activation" is used to describe "turning-on" of a device, a component or a signal. The term "inactivation" describes "turning-off" of a device, a component or a signal.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. An input/output (IO) circuit powered by an input/output (IO) supply voltage, the IO circuit comprising:
a pre-driver circuit configured to receive the IO supply voltage, and configured to generate a first invert signal and a second invert signal;
a cutoff circuit configured to receive a pad voltage and the first invert signal;
an output stage coupled to the cutoff circuit; and
a pad coupled to the output stage, and a voltage generated at the pad is the pad voltage, wherein the cutoff circuit and the output stage are configured to maintain the pad voltage at logic high when the IO supply voltage transition below a defined threshold.

2. The IO circuit of claim 1 further comprising:
a first inverter coupled to the pre-driver circuit, and configured to generate a first signal in response to the first invert signal and the IO supply voltage; and
a second inverter coupled to the pre-driver circuit, and configured to generate a second signal in response to the second invert signal and the IO supply voltage.

3. The IO circuit of claim 2 further comprising a bias voltage generator configured to generate a control signal and a bias voltage in response to the IO supply voltage and the pad voltage.

4. The IO circuit of claim 3 further comprising:
a first hold circuit coupled to the pre-driver circuit and the cutoff circuit, the first hold circuit configured to receive the control signal;
a second hold circuit coupled to the pre-driver circuit and the output stage, the second hold circuit configured to receive the pad voltage; and
a third hold circuit coupled to the bias voltage generator, the third hold circuit configured to receive the control signal and the IO supply voltage.

5. The IO circuit of claim 3, wherein the cutoff circuit comprises:
a third inverter configured to generate a third signal in response to the first invert signal and the pad voltage; and
a primary PMOS transistor whose gate terminal is configured to receive the third signal, whose body terminal is configured to receive the bias voltage and whose source terminal is configured to receive the IO supply voltage.

6. The IO circuit of claim 4, wherein the output stage comprises:

a first PMOS transistor whose gate terminal is configured to receive the first signal and whose body terminal is configured to receive the bias voltage, wherein a drain terminal of the primary PMOS transistor is coupled to a source terminal of the first PMOS transistor; and a first NMOS transistor whose gate terminal is configured to receive the second signal and whose source terminal is coupled to a ground terminal, wherein a drain terminal of the first NMOS transistor and a drain terminal of the first PMOS are coupled to form a first node which is coupled to the pad.

7. The IO circuit of claim 3, wherein the bias voltage generator comprises:

a fourth inverter configured to generate the control signal in response to the IO supply voltage and the pad voltage;

a second PMOS transistor whose gate terminal is configured to receive the IO supply voltage and whose source terminal is configured to receive the pad voltage; and a third PMOS transistor whose gate terminal is configured to receive the control signal, and whose source terminal is configured to receive the IO supply voltage, wherein a drain terminal of the second PMOS transistor and a drain terminal of the third PMOS transistor are coupled to form a second node, wherein the bias voltage is generated at the second node.

8. The IO circuit of claim 6, wherein:

the first hold circuit comprises a second NMOS transistor whose gate terminal is configured to receive the control signal, and whose drain terminal is configured to receive the first invert signal;

the second hold circuit comprises a third NMOS transistor whose gate terminal is configured to receive the pad voltage, and whose drain terminal is configured to receive the second signal; and the third hold circuit comprises a fourth NMOS transistor whose gate terminal is configured to receive the control signal, and whose drain terminal is configured to receive the IO supply voltage, wherein a source terminal of each of the second NMOS transistor, the third NMOS transistor and the fourth NMOS transistor is coupled to the ground terminal.

9. The IO circuit of claim 5, wherein the pad is configured to receive an external supply voltage through an external resistor.

10. The IO circuit of claim 9, wherein when the IO supply voltage transition below the defined threshold:

the external supply voltage drives the pad voltage to logic high;

the control signal generated by the fourth inverter follows the pad voltage which inactivates the third PMOS transistor;

the bias voltage generated at the second node follows the pad voltage as the second PMOS transistor is activated and the third PMOS transistor is inactivated;

the second NMOS transistor is activated as the control signal follows the pad voltage, wherein the first invert signal transitions to logic low when the second NMOS transistor is activated;

the third signal transitions to pad voltage which inactivates the primary PMOS transistor;

the first signal transitions to the IO supply voltage which maintains the first PMOS transistor in activated state; and the second signal is maintained at logic low when the third NMOS transistor is activated by the pad voltage, and wherein the first NMOS transistor is inactivated when the second signal is at logic low.

11. A method comprising:

generating a first invert signal and a second invert signal from an input/output (I/O) supply voltage;

detecting when the input/output (IO) supply voltage transitions below a defined threshold;

driving a pad voltage to logic high; and configuring a cutoff circuit and an output stage to maintain the pad voltage at logic high, wherein the output stage is coupled to a pad and a voltage at the pad is the pad voltage, and wherein the cutoff circuit is configured to receive the pad voltage and the first invert signal.

12. The method of claim 11, wherein configuring the cutoff circuit further comprises inactivating a primary PMOS transistor driven by the pad voltage, and configuring the output stage further comprises tri-stating the output stage.

13. The method of claim 12, wherein tri-stating the output stage further comprises:

generating a control signal from the pad voltage and the IO supply voltage;

generating a bias voltage from the pad voltage, the IO supply voltage and the control signal;

configuring the control signal and the bias voltage to follow the pad voltage when the pad voltage is at logic high;

configuring the first invert signal to transition to a logic low when the control signal follows the pad voltage;

configuring a first signal to transition to the IO supply voltage which maintains a first PMOS transistor in the output stage in activated state; and maintaining a second signal at logic low which inactivates a first NMOS transistor in the output stage.

14. The method of claim 13, wherein inactivating a primary PMOS transistor further comprises:

generating a third signal from the first invert signal and the pad voltage; and configuring the third signal to transition to the pad voltage, wherein the third signal is provided to a gate terminal of the primary PMOS transistor, and a drain terminal of the primary PMOS transistor is coupled to a source terminal of the first PMOS transistor.

15. The method of claim 11, wherein the pad voltage is driven to logic high by an external supply voltage.

16. A computing device comprising:

a processing unit;

a memory module coupled to the processing unit;

a plurality of logic circuits coupled to the processing unit and the memory module; and an input/output (IO) circuit coupled to at least one logic circuit of the plurality of logic circuits, the IO circuit comprising:

a pre-driver circuit configured to receive the IO supply voltage, and configured to generate a first invert signal and a second invert signal;

a cutoff circuit configured to receive a pad voltage and the first invert signal;

an output stage coupled to the cutoff circuit; and a pad coupled to the output stage, and a voltage generated at the pad is the pad voltage, wherein the cutoff circuit and the output stage are configured to maintain the pad voltage at logic high when an IO supply voltage transition below a defined threshold.

17. The computing device of claim 16 further comprising:
a first inverter coupled to the pre-driver circuit, and configured to generate a first signal in response to the first invert signal and the IO supply voltage; and
a second inverter coupled to the pre-driver circuit, and configured to generate a second signal in response to the second invert signal.

18. The computing device of claim 17 further comprising a bias voltage generator configured to generate a control signal and a bias voltage in response to the IO supply voltage and the pad voltage.

19. The computing device of claim 18 further comprising:
a first hold circuit coupled to the pre-driver circuit and the cutoff circuit, the first hold circuit configured to receive the control signal;
a second hold circuit coupled to the pre-driver circuit and the output stage, the second hold circuit configured to receive the pad voltage; and
a third hold circuit coupled to the bias voltage generator, the third hold circuit configured to receive the control signal and the IO supply voltage.

20. The computing device of claim 18, wherein the cutoff circuit comprises:
a third inverter configured to generate a third signal in response to the first invert signal and the pad voltage; and
a primary PMOS transistor whose gate terminal is configured to receive the third signal, whose body terminal is configured to receive the bias voltage and whose source terminal is configured to receive the IO supply voltage.

21. The computing device of claim 16, wherein the pad is configured to receive an external supply voltage through an external resistor.

* * * * *